(12) United States Patent
Wu et al.

(10) Patent No.: US 11,380,620 B2
(45) Date of Patent: Jul. 5, 2022

(54) SEMICONDUCTOR PACKAGE INCLUDING CAVITY-MOUNTED DEVICE

(71) Applicant: Taiwan Semiconductor Manufacturing Company, Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/441,716

(22) Filed: Jun. 14, 2019

(65) Prior Publication Data
US 2020/0395308 A1 Dec. 17, 2020

(51) Int. Cl.
| | |
|---|---|
| *H01L 23/495* | (2006.01) |
| *H01L 23/538* | (2006.01) |
| *H01L 23/16* | (2006.01) |
| *H01L 23/31* | (2006.01) |
| *H01L 21/48* | (2006.01) |
| *H01L 21/56* | (2006.01) |

(52) U.S. Cl.
CPC ........ *H01L 23/5389* (2013.01); *H01L 21/486* (2013.01); *H01L 21/4853* (2013.01); *H01L 21/4857* (2013.01); *H01L 21/563* (2013.01); *H01L 21/568* (2013.01); *H01L 23/16* (2013.01); *H01L 23/3128* (2013.01); *H01L 23/5383* (2013.01)

(58) Field of Classification Search
None
See application file for complete search history.

(56) References Cited

U.S. PATENT DOCUMENTS

| | | | |
|---|---|---|---|
| 8,164,171 B2 * | 4/2012 | Lin | H01L 23/5385 257/686 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,975,726 B2 * | 3/2015 | Chen | H01L 24/19 257/532 |
| 8,993,380 B2 | 3/2015 | Hou et al. | |

(Continued)

FOREIGN PATENT DOCUMENTS

| | | |
|---|---|---|
| KR | 20120040038 A | 4/2012 |
| KR | 20180064743 A | 6/2018 |

(Continued)

*Primary Examiner* — Hung K Vu
(74) *Attorney, Agent, or Firm* — Slater Matsil, LLP

(57) ABSTRACT

A semiconductor package and methods of forming the same are disclosed. In an embodiment, a package includes a substrate; a first die disposed within the substrate; a redistribution structure over the substrate and the first die; and an encapsulated device over the redistribution structure, the redistribution structure coupling the first die to the encapsulated device.

20 Claims, 17 Drawing Sheets

(56) References Cited

U.S. PATENT DOCUMENTS

| | | | |
|---|---|---|---|
| 9,087,701 B2* | 7/2015 | Park | H01L 24/19 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,620,484 B2* | 4/2017 | Kim | H01L 25/0657 |
| 9,666,502 B2 | 5/2017 | Chen et al. | |
| 9,735,131 B2 | 8/2017 | Su et al. | |
| 10,418,317 B2 | 9/2019 | Lee et al. | |
| 2008/0217761 A1* | 9/2008 | Yang | H01L 25/50 |
| | | | 257/700 |
| 2008/0224306 A1* | 9/2008 | Yang | H01L 24/24 |
| | | | 257/725 |
| 2008/0237836 A1 | 10/2008 | Chia et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0097532 A1 | 4/2014 | Chiang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0179608 A1 | 6/2015 | Sung et al. | |
| 2019/0131284 A1* | 5/2019 | Jeng | H01L 21/565 |

FOREIGN PATENT DOCUMENTS

| | | |
|---|---|---|
| TW | 200834876 A | 8/2008 |
| TW | 201917839 A | 5/2019 |
| WO | 2016126881 A1 | 8/2016 |

* cited by examiner

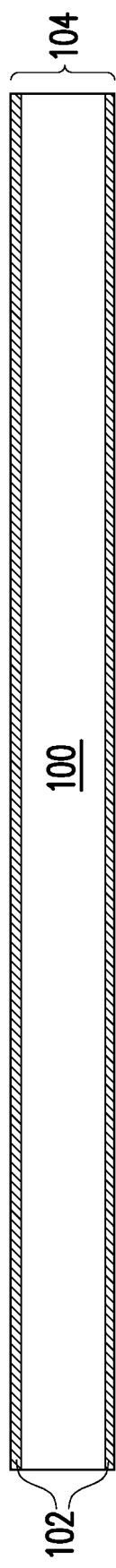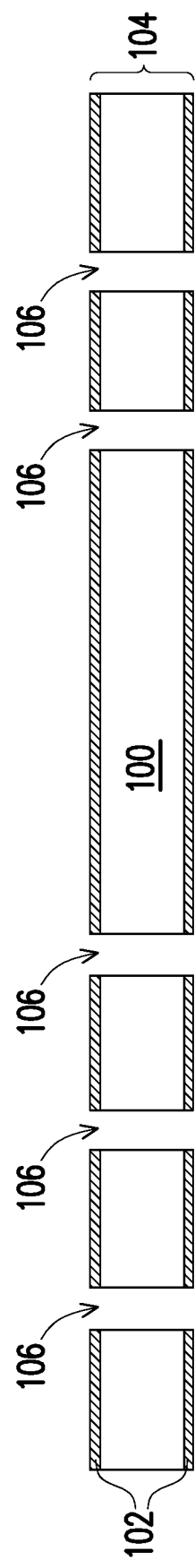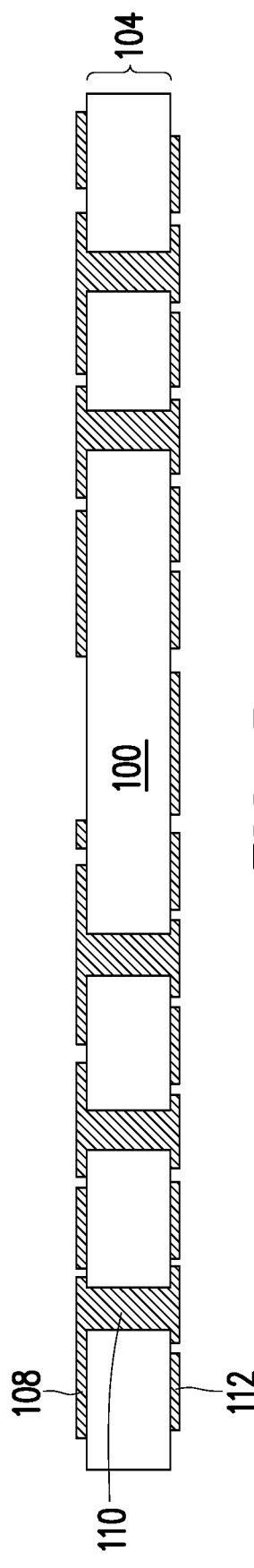

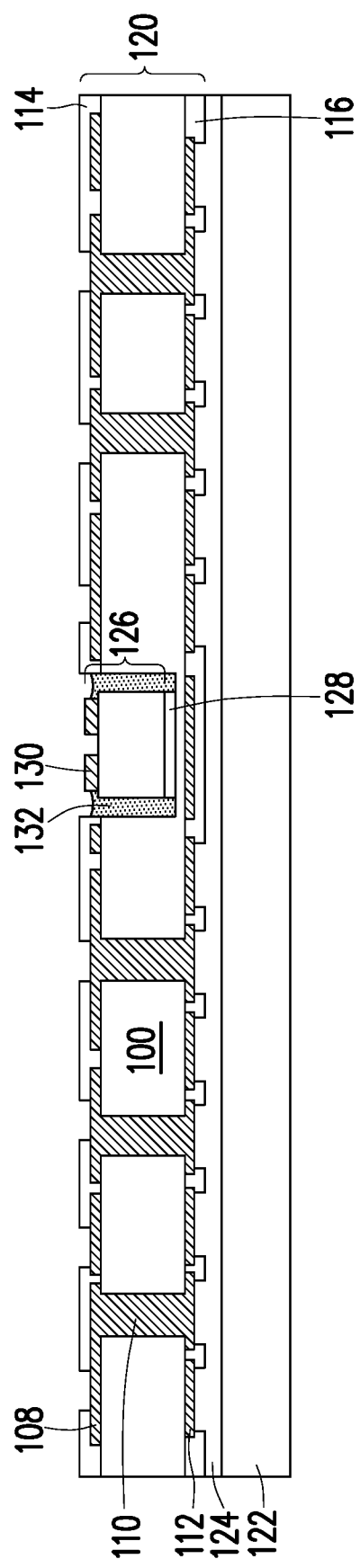
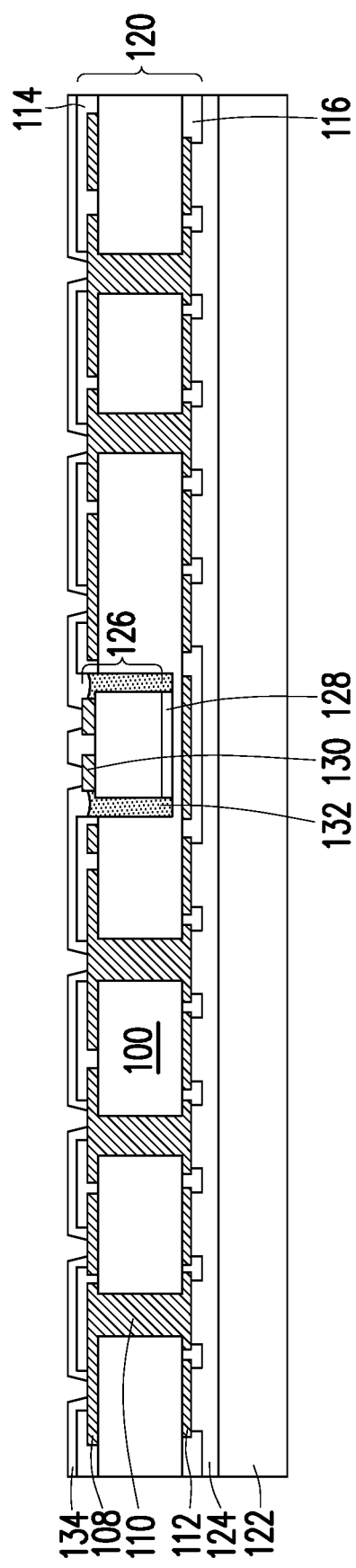
FIG. 8
FIG. 9

SEMICONDUCTOR PACKAGE INCLUDING CAVITY-MOUNTED DEVICE

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. However, small packages may be desired for applications where miniaturization is important.

Integrated fan-out (InFO) package technology is becoming increasingly popular, particularly when combined with wafer-level packaging (WLP) technology. InFO packages may include integrated circuits packaged in packages that typically include a redistribution layer (RDL) or post-passivation interconnect that is used to fan-out wiring for contact pads of the package, so that electrical contacts can be made on a larger pitch than contact pads of the integrated circuit. Resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a core substrate, in accordance with some embodiments.

FIG. 2 illustrates a formation of openings in the core substrate, in accordance with some embodiments.

FIG. 3 illustrates a formation of conductive traces and conductive plugs in the core substrate, in accordance with some embodiments.

FIG. 8 illustrates a formation of an underfill surrounding the passive device, in accordance with some embodiments.

FIGS. 9-15 illustrate a formation of a front-side redistribution structure over the substrate and the passive device, in accordance with some embodiments.

DETAILED DESCRIPTION

Figure 4:
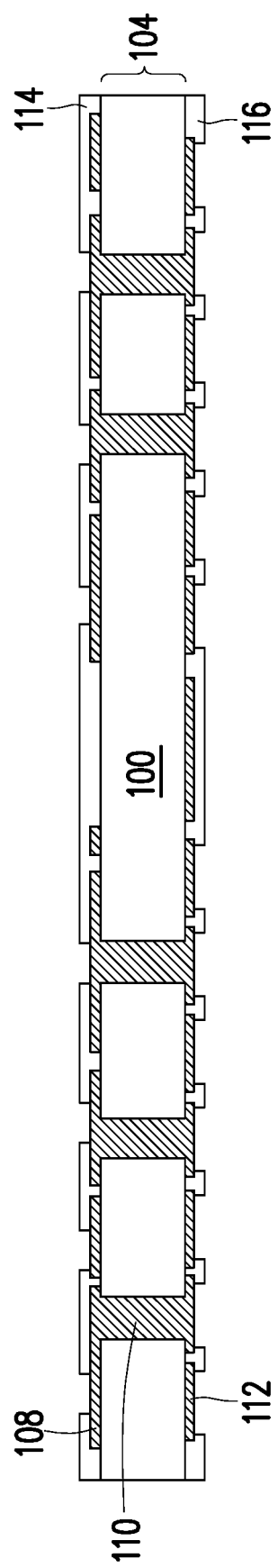
FIG. 4 illustrates a formation of a dielectric layer and a protective layer over the core substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments relate to packaged semiconductor devices and methods of forming the same. The packaged semiconductor devices may be system on integrated substrate (SoIP) packages, system-in-packages (SiPs), or the like. A cavity may be formed in a core substrate, and an electronic component, such as a multilayer ceramic capacitor (MLCC), an integrated passive device (IPD), an integrated voltage regulator (IVR), a static random access memory (SRAM), or the like may be attached to the core substrate in the cavity. Redistribution layers (RDLs) may be formed over the core substrate and the electronic component and an electronic device, such as a chip-on-wafer (CoW), an integrated fan-out (InFO) package, a die, or another package may be attached to the RDLs. Embedding the electronic component in the core substrate shortens the distance between the electronic component and the electronic device, which reduces the voltage drop between the electronic component and the electronic device and improves the power integrity and overall performance of the packaged semiconductor device.

Referring first to FIG. 1 there is shown a substrate 104 including an insulation layer 100 with conductive layers 102 on both sides of the insulation layer 100, in accordance with some embodiments. The substrate 104 may be a core substrate. In some embodiments, the substrate 104 is a double-sided copper clad laminate (CCL). The insulation layer 100 may be an organic substrate, a ceramic substrate, a preimpregnated composite fiber (prepreg), Ajinomoto Build-up Film (ABF), paper, glass fiber, non-woven glass fabric, other insulating materials, or combinations thereof. The conductive layers 102 may be one or more layers of copper, nickel, aluminum, other conductive materials, or a combination thereof laminated or formed onto opposing sides of the insulation layer 100.

Referring to FIG. 2, openings 106 are formed in the substrate 104. In some embodiments, the openings 106 are formed by laser drilling. Other processes, e.g., mechanical drilling, etching, or the like, may also be used. The openings 106 may have a rectangular, circular, or other shape in a top-down view.

Referring to FIG. 3, the openings 106 (see FIG. 2) are filled to form conductive plugs 110, first conductive traces 108, and second conductive traces 112, in accordance with some embodiments. Conductive traces, such as the first conductive traces 108 and the second conductive traces 112, can be used to form routing lines to redistribute electrical signals or as die connector pads to which die connectors may be attached. Prior to depositing a conductive material within the openings 106, a surface preparation process may be performed. The surface preparation process may include cleaning the exposed surfaces of the substrate 104 (e.g., surfaces of the conductive layers 102 and surfaces of the insulation layer 100 in the openings 106) with one or more cleaning solutions (e.g., sulfuric acid, chromic acid, neutralizing alkaline solution, water rinse etc.) to remove or reduce soil, oils, and/or native oxide films. A desmear process may be performed to clean the area near the openings 106, which may have been smeared with the material of the insulation layer 100 that was removed to form the openings 106. The desmearing may be accomplished mechanically (e.g., blasting with a fine abrasive in a wet slurry), chemically (e.g., rinsing with a combination of organic solvents, permanganate etc.), or by a combination of mechanical and chemical desmearing. Following cleaning, treatment with a chemical conditioner, which facilitates adsorption of an activator used during subsequent electroless plating, may be used. In some embodiments, the conditioning step may be followed by micro-etching the conductive layers 102 to micro-roughen the conductive surfaces of the conductive layers 102 for better bonding between the conductive layers 102 and later-deposited conductive material.

Forming the conductive plugs 110, the first conductive traces 108, and the second conductive traces 112 may include forming a patterned mask layer and selectively depositing conductive materials (e.g., copper, other metals, metal alloys, or the like) in the openings in the patterned mask layer using a metal electroless plating technique. The patterned mask layer may be formed by coating the surface with a photoresist layer, exposing the photoresist layer to an optical pattern, and developing the exposed photoresist layer to form openings in the photoresist layer that define a pattern of the region where conductive material may be selectively deposited.

After forming the first conductive traces 108 and the second conductive traces 112, the patterned mask layer (e.g., the photoresist) may be stripped. Portions of the conductive layers 102 that were covered by the patterned mask layer may be removed using a suitable etching process. Removal of the unwanted portions of the conductive layers 102 prevents unwanted electrical shorts between the conductive features formed in the regions that were exposed by the patterned mask layer. The conductive plugs 110, the first conductive traces 108, and the second conductive traces 112 may be formed in the above-described manner on both sides of the substrate 104. The cross-sectional view illustrated in FIG. 3 shows the state of the substrate 104 after the conductive layers 102 have been etched as described above.

As discussed in greater detail below, the substrate 104 will act as a base for forming a cavity-containing core substrate 120 (not illustrated in FIG. 3, but shown in FIG. 5). In FIG. 3, the first conductive traces 108 are formed on a side of the insulating layer 100 in which a cavity 118 (not illustrated in FIG. 3, but shown in FIG. 5) is formed during subsequent processing steps. In accordance with some embodiments the first conductive traces 108 may be omitted from the region in which the cavity may be subsequently formed, e.g., the region between the innermost conductive plugs 110 in this example.

Although not illustrated in this example, it is understood that the method of using a metal-clad laminate, forming openings extending through the metal-clad laminate, forming a patterned conductive trace layer (e.g., using electroless deposition, or electroplating, or the like), and removing unwanted metal cladding may be performed repeatedly to vertically stack multiple alternating layers of insulation material and conductive traces with conductive plugs for connecting vertically adjacent layers of conductive traces.

Referring to FIG. 4, a dielectric layer 114 and a protective layer 116 are formed over the first conductive traces 108 and the second conductive traces 112, respectively, and the substrate 104. In some embodiments, the dielectric layer 114 is formed of a polymer, which may be a photo-sensitive material such as PBO, polyimide, BCB, or the like, that may be patterned using a lithography mask. The dielectric layer 114 may be formed by spin coating, lamination, chemical vapor deposition (CVD), the like, or a combination thereof. The dielectric layer 114 is patterned to form openings exposing portions of the first conductive traces 108. The patterning may be done by exposing the dielectric layer 114 to light and developing the dielectric layer 114 when the dielectric layer 114 is a photo-sensitive material. The dielectric layer 114 may also be formed of materials which are not photo-sensitive such as silicon nitride, silicon oxide, phosphosilicate glass (PSG), borophosphosilicate glass (BPSG), or the like. In embodiments in which the dielectric layer 114 is formed of material that are not photosensitive, the dielectric layer 114 may be patterned by etching with a suitable etching process (e.g., anisotropic reactive ion etching) through a patterned photoresist mask.

In various embodiments, the protective layer 116 may be a solder resist or the like formed over the second conductive traces 112 to protect areas of the insulation layer 100 from external damage. The protective layer 116 may be patterned to form openings exposing portions of the second conductive traces 112. In embodiments in which the protective layer 116 is formed of a photo-sensitive material, the patterning may be done by exposing the protective layer 116 to light and developing the protective layer 116. In embodiments in which the protective layer 116 is formed of material that are not photosensitive, the protective layer 116 may be patterned by etching with a suitable etching process (e.g., anisotropic reactive ion etching) through a patterned photoresist mask. The openings exposing the second conductive traces 112 may be used as die connector pads to which conductive connectors 198 (not illustrated in FIG. 4, but shown in FIG. 21) may be subsequently attached.

Figure 5:
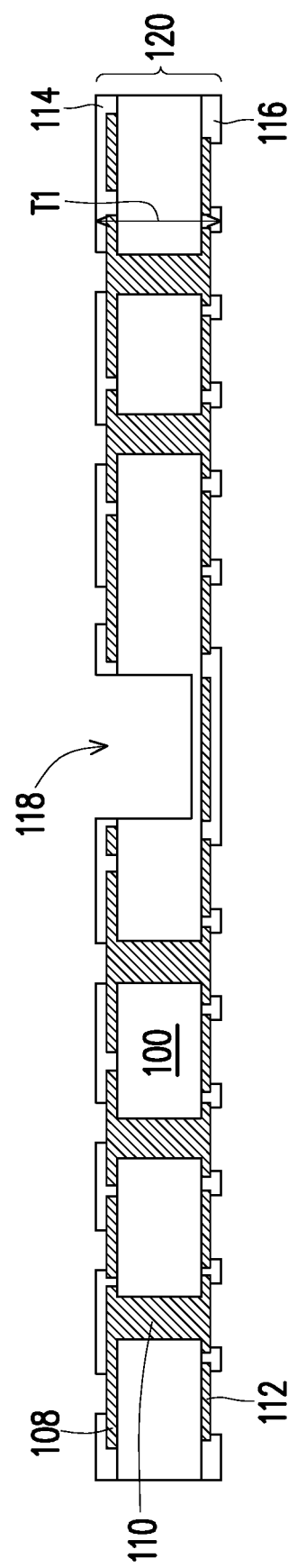
FIG. 5 illustrates a formation of a cavity in the core substrate, in accordance with some embodiments.

In FIG. 5 a cavity 118 is formed by removing a portion of the insulation layer 100, in accordance with some embodiments. The removal of the portion of the insulation layer 100 does not affect the first conductive traces 108 located on the same side of the insulation layer 100 that is recessed by the removal process. As mentioned above with reference to FIG. 3, the patterned mask used to form the first conductive traces 108 may be designed to exclude the first conductive traces 108 from being formed over a portion of the insulating layer 100 where the cavity 118 is formed. The removal of material to form the cavity 118 may be performed by a computer numeric control (CNC) machining process in which the material is removed by a mechanical drill. As illustrated in FIG. 5, the resulting structure is a cavity substrate 120. The insulation layer 100 of the cavity substrate 120 may have a thickness T1 from about 25 µm to about 2,000 µm, such as about 250 µm or about 500 µm. The cavity 118 may have a depth from about 10 µm to about 1,000 µm, such as about 70 µm or about 400 µm. The cavity 118 may have an area from about 1 mm by 1 mm to about 20 mm by 20 mm, such as about 1.5 mm by 1.5 mm or about 5.0 mm by 4.0 mm. In some embodiments, a portion of the insulation layer 100 may remain along the bottom of the cavity 118 and may have a thickness from about 20 µm to about 1,600 µm, such as about 30 µm or about 800 µm. Other processes may also be used to form the cavity 118, such as laser drilling, etching, and/or the like.

Figure 6:
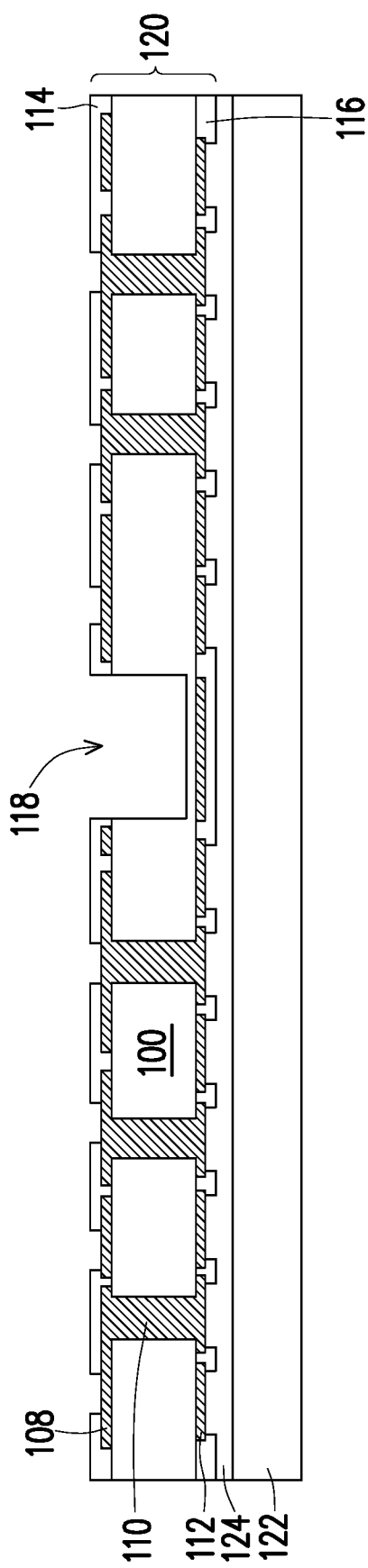
FIG. 6 illustrates a bonding of the substrate to a carrier, in accordance with some embodiments.

In FIG. 6, the cavity substrate 120 is attached to a carrier substrate 122 using a release layer 124, in accordance with some embodiments. As illustrated in FIG. 6, the cavity substrate 120 may be attached to the carrier substrate 122 using the release layer 124 such that the cavity 118 is located opposite the release layer 124. The carrier substrate 122 may be a glass carrier substrate, a ceramic carrier substrate, or the like. The release layer 124 may be a polymer-based material, an epoxy-based thermal-release material such as a light-to-heat-conversion (LTHC) release coating, or ultra-violet (UV) glue (e.g., a glue which loses its adhesive property when exposed to UV light). The release layer 124 may aid in the removal of the carrier substrate 122 during subsequent processing. The release layer 124 may be removed along with the carrier substrate 122 during the subsequent processing.

Figure 7A:
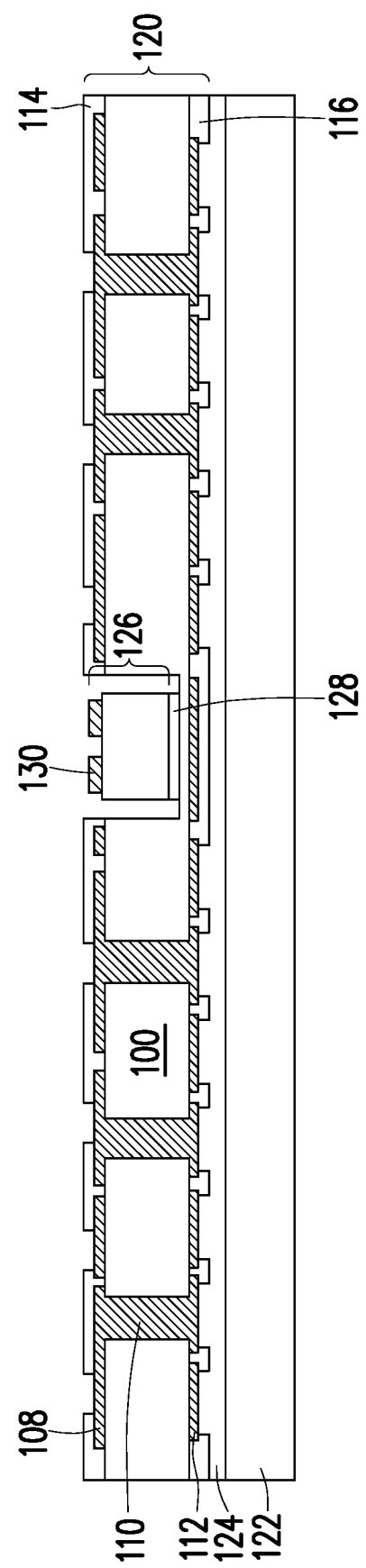
FIG. 7A illustrates an attachment of a first die within the cavity, in accordance with some embodiments.

In FIG. 7A, a first die 126 is placed inside the cavity 118 (illustrated in FIG. 6), in accordance with some embodiments. The first die 126 may be placed inside the cavity 118 using a pick-and-place (PnP) tool. The first die 126 may be a passive device, such as a multilayer ceramic chip (MLCC) capacitor; an integrated passive device (IPD); an integrated voltage regulator (IVR), the like, or a combination thereof; or an active device such as a memory die (e.g., a static random-access memory (SRAM) die, a dynamic random-access memory (DRAM) die, a high bandwidth memory (HBM) die, or the like), a logic chip, an analog chip, a microelectromechanical systems (MEMS) chip, a radio frequency (RF) chip, the like, or a combination thereof. In some embodiments, the first die 126 is adhered to the insulation layer 100 by an adhesive 128. Although FIG. 7A illustrates one first die 126 placed in the cavity 118, it should be appreciated that multiple dies or devices may also be placed in the cavity 118 of the cavity substrate 120. For example, in some embodiments, the first die 126 may be a plurality of devices placed laterally adjacent to one another and/or stacked upon each other, wherein the multiple devices may have the same or different sizes. Before being placed onto the cavity substrate 120, the first die 126 may be processed according to applicable manufacturing processes to form the respective device structure. The first die 126 may include connection terminals 130 (e.g., aluminum pads, copper pads, or the like) to which external connections are made. The first die 126 may have a height from about 30 µm to about 350 µm, a length from about 0.5 mm to about 0.8 mm, and a width from about 0.5 mm to about 0.8 mm.

The adhesive 128 may be attached to a backside of the first die 126 and may attach the first die 126 to the insulation layer 100. The adhesive 128 may be any suitable adhesive, epoxy, die attach film (DAF), or the like. The adhesive 128 may be applied to the backside of the first die 126 prior to singulation of the first die 126. The first die 126 may be singulated, such as by sawing or dicing, and adhered to the insulation layer 100 by the adhesive 128 using, for example, a PnP tool. In some embodiments, the adhesive 128 may be attached to the cavity substrate 120 prior to placing the first die 126 in the cavity 118.

Figure 7B:
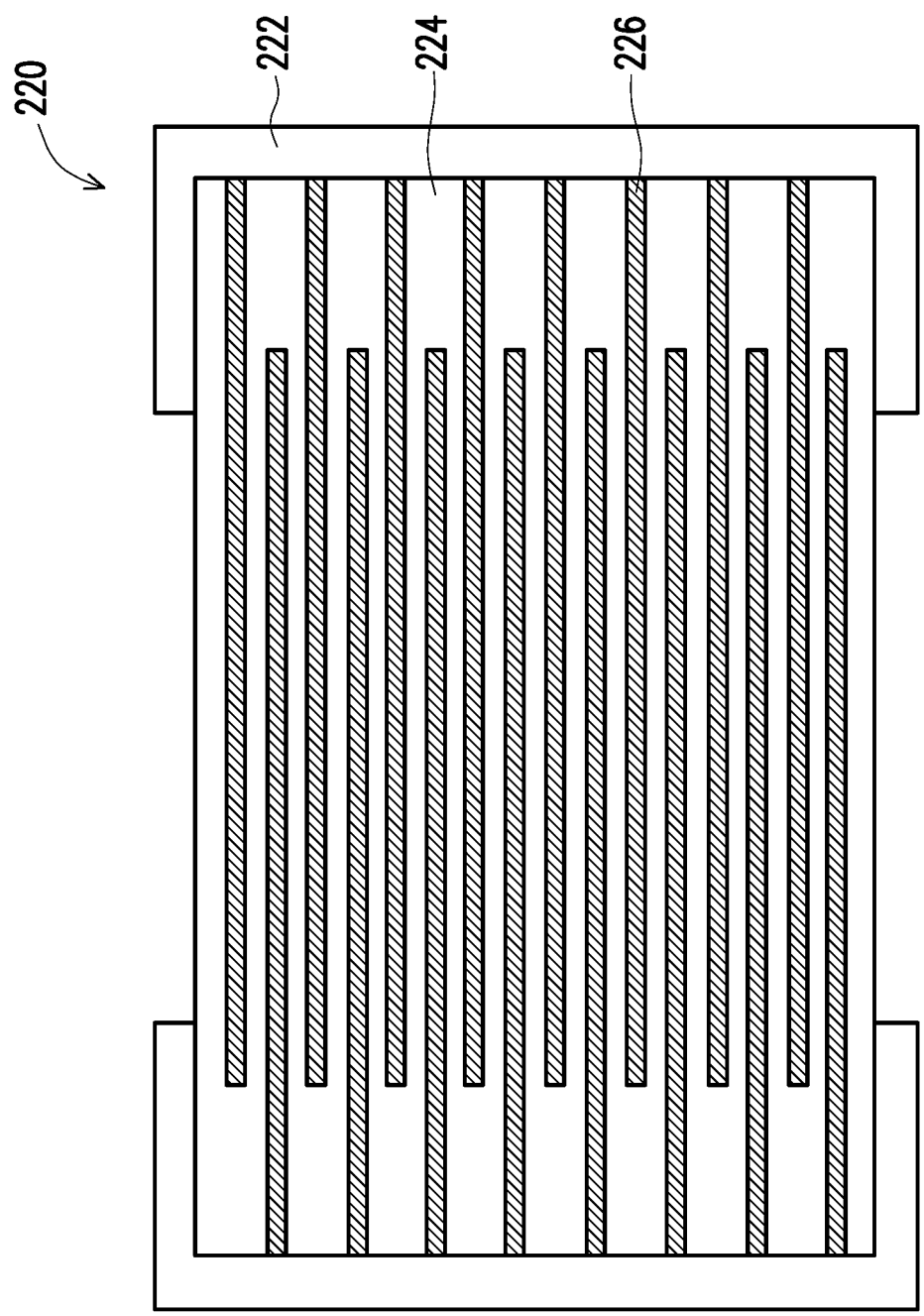
FIG. 7B illustrates a multilayer ceramic capacitor, in accordance with some embodiments.

FIG. 7B illustrates an MLCC 220 which may be used as the first die 126. As illustrated in FIG. 7B, the MLCC 220 includes electrodes 226 sandwiched between layers of ceramic 224. The MLCC 220 further includes connecting terminals 222 for external connection.

In FIG. 8, an underfill 132 is formed between sidewalls of the first die 126 and the cavity substrate 120, in accordance with some embodiments. The underfill 132 may be formed by a capillary flow process after the first die 126 is attached or may be formed by a suitable deposition method before the first die 126 is attached. The underfill 132 may be a material such as a molding compound, an epoxy, an underfill, a molding underfill (MUF), a resin, or the like. The underfill 132 may reduce stress between the first die 126 and the cavity substrate 120 and may help to secure the first die 126 in the cavity 118. As illustrated in FIG. 8, upper surfaces of the underfill 132 may be concave; however, in some embodiments, the upper surfaces of the underfill 132 may be convex or planar.

FIGS. 9 through 15 illustrate the formation of a front-side redistribution structure 140 (shown in FIG. 15) over the connection terminals 130 of the first die 126 and the first conductive traces 108 of the cavity substrate 120, in accordance with some embodiments. The front-side redistribution structure 140 includes a vertical stack of alternating layers of dielectric and conductive traces. Each layer of conductive traces is separated from vertically adjacent layers of conductive traces by a dielectric layer. The conductive traces extend through underlying dielectric layers to form conductive vias used to interconnect vertically adjacent conductive traces. The front-side redistribution structure 140 and the cavity substrate 120 together form a first package 101 (shown in FIG. 15).

In FIG. 9 a dielectric layer 134 is formed over the cavity substrate 120, the underfill 132, and the first die 126. In some embodiments, the dielectric layer 134 is formed of a polymer, which may be a photo-sensitive material such as PBO, polyimide, BCB, or the like, that may be patterned using a lithography mask. The dielectric layer 134 may be formed by spin coating, lamination, chemical vapor deposition (CVD), the like, or a combination thereof. The dielectric layer 134 is patterned to form openings exposing portions of the connection terminals 130 and the first conductive traces 108. The patterning may be done by exposing the dielectric layer 134 to light when the dielectric layer 134 is a photo-sensitive material. The dielectric layer 134 may also be formed of materials which are not photo-sensitive such as silicon nitride, silicon oxide, phosphosilicate glass (PSG), borophosphosilicate glass (BPSG), or the like. In embodiments in which the dielectric layer 134 is formed of materials that are not photosensitive, the dielectric layer 134 may be patterned by etching with a suitable etching process (e.g., anisotropic reactive ion etching) through a patterned photoresist mask.

Figure 10:
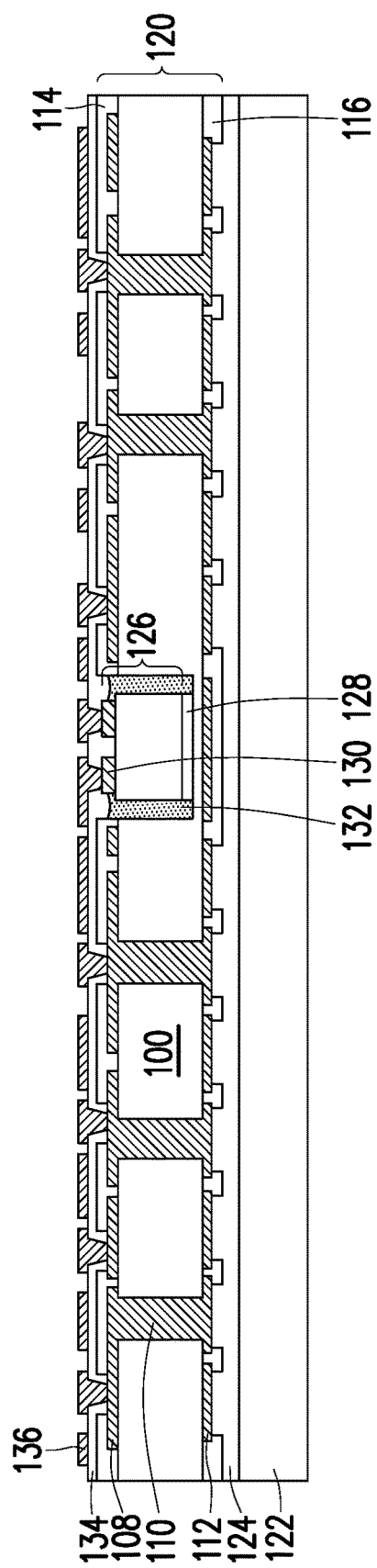

In FIG. 10, a metallization pattern 136 is formed on and extending through the dielectric layer 134. As an example of forming the metallization pattern 136, a seed layer (not separately illustrated) is formed over the dielectric layer 134. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD), CVD, or the like. A photoresist (not separately illustrated) is then formed and patterned on the seed layer. The photoresist may be formed by spin coating or the like, may be exposed to patterned light or another patterned energy source, and may be exposed to a developer to remove exposed or unexposed portions of the photoresist. The pattern of the photoresist corresponds to the metallization pattern 136. The patterning forms openings through the photoresist to expose the seed layer. A conductive material (not separately illustrated) is formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The photoresist and portions of the seed layer on which the conductive material is not formed are then removed. The photoresist may be removed by an acceptable ashing or stripping process, such as using an oxygen plasma or the like. Once the photoresist is removed, exposed portions of the seed layer are removed using an acceptable etching process such as wet or dry etching. The remaining portions of the seed layer and the conductive material form the metallization pattern 136. The metallization pattern 136 includes conductive traces formed along the top surface of the dielectric layer 134 and conductive vias through the dielectric layer 134. The vias connect the conductive traces of metallization pattern 136 electrically and physically to the metal pattern directly below the dielectric layer 134 (e.g., the first conductive traces 108 and the connection terminals 130).

The method of forming the dielectric layer 134 (discussed with respect to FIG. 9) and the conductive traces and vias of the metallization pattern 136 (discussed with respect to FIG. 10) is described merely as an example. It should be appreciated that the processes for forming the dielectric layer 134 and the metallization pattern 136 may be varied based on the specifications of the design, e.g., the desired minimum dimensions of the patterns. For example, in some embodiments a damascene process (e.g., a single or a dual damascene process) may be utilized. The front-side redistribution structure 140 may be built up by vertically stacking additional dielectric layers and metallization patterns.

Figure 11:
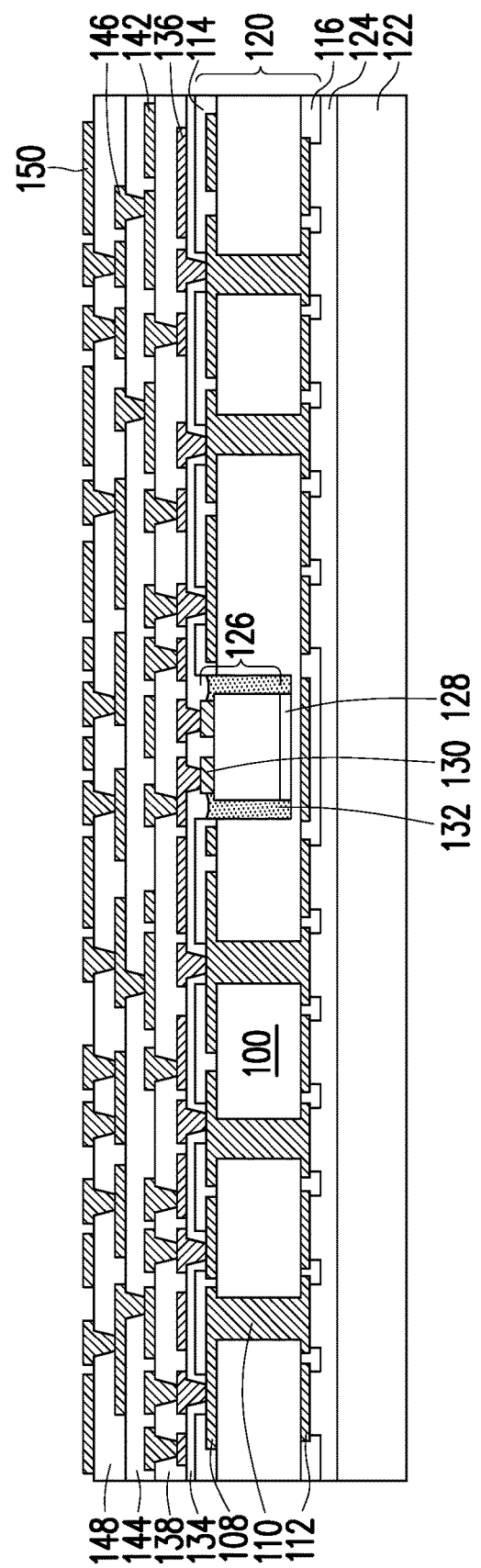

FIG. 11 illustrates additional dielectric layers 138, 144, and 148 formed over a top surface of the dielectric layer 134 and the metallization pattern 136. Also illustrated in FIG. 11 are metallization patterns 142, 146, and 150. The metallization patterns 142, 146, and 150 include conductive traces formed along the top surfaces of the respective dielectric layers 138, 144, and 148 and conductive vias extending through the respective dielectric layers 138, 144, and 148. The vias of the metallization patterns 142, 146, and 150 connect the conductive traces of the metallization patterns 142, 146, and 150 electrically and physically to the respective metallization patterns directly below the respective dielectric layers 138, 144, and 148 (e.g., the respective metallization patterns 136, 142, and 146). Processes, techniques, and materials similar to those described above with respect to the dielectric layer 134 and the metallization pattern 136 may be repeated to form the dielectric layers 138, 144, and 148 and the metallization patterns 142, 146, and 150.

Figure 12:
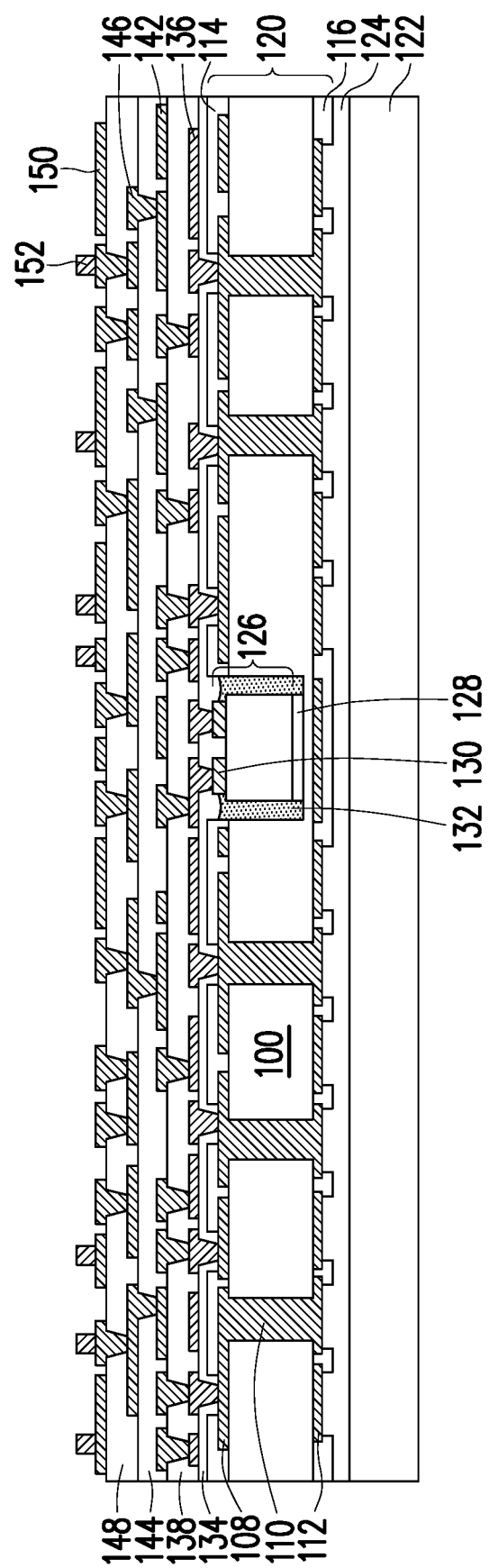

In FIG. 12, conductive pillars 152 are formed on the metallization pattern 150. As an example of forming the conductive pillars 152, a seed layer (not separately illustrated) is formed over the dielectric layer 148 and the metallization pattern 150. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, CVD, or the like. A photoresist (not separately illustrated) is then formed and patterned on the seed layer. The photoresist may be formed by spin coating or the like, may be exposed to patterned light or another patterned energy source, and may be exposed to a developer to remove exposed or unexposed portions of the photoresist. The pattern of the photoresist corresponds to the conductive pillars 152. The patterning forms openings through the photoresist to expose the seed layer. A conductive material (not separately illustrated) is formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The photoresist and portions of the seed layer on which the conductive material is not formed are then removed. The photoresist may be removed by an acceptable ashing or stripping process, such as using an oxygen plasma or the like. Once the photoresist is removed, exposed portions of the seed layer are removed using an acceptable etching process such as wet or dry etching. The remaining portions of the seed layer and the conductive material form the conductive pillars 152. The conductive pillars 152 are electrically and physically connected to the metallization pattern 150.

Figure 13:
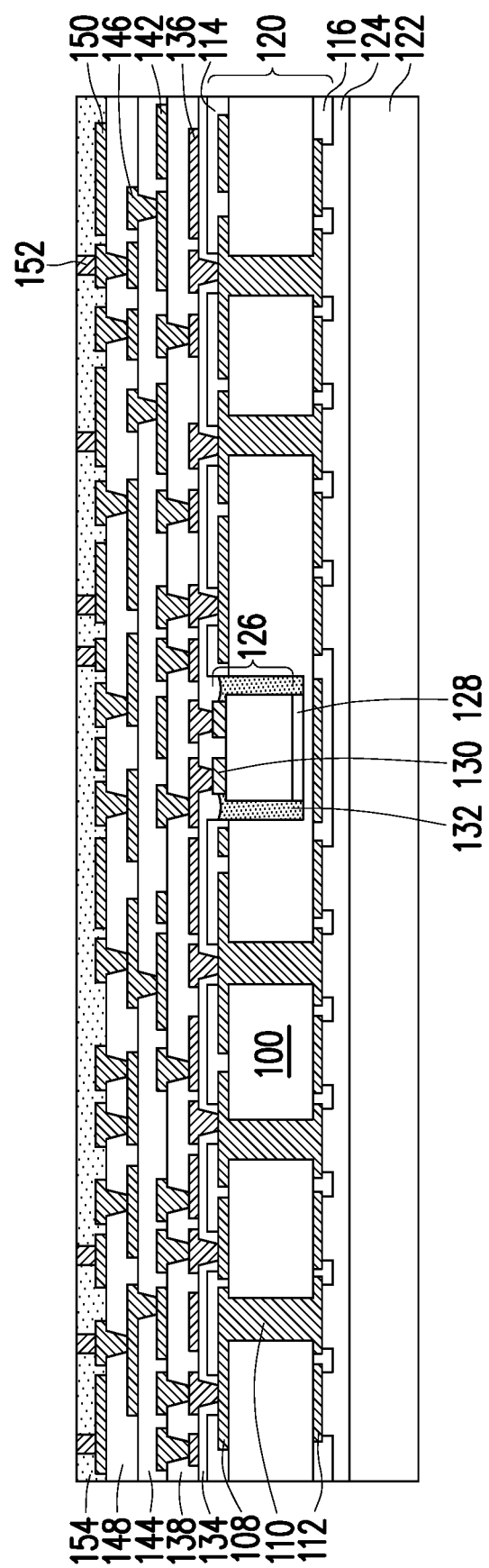

Referring now to FIG. 13, the conductive pillars 152 may be embedded in an insulating layer 154 by, for example, laminating a build-up film such as, ABF, or a prepreg, or the like, and using an etch-back or planarization process, such as CMP, grinding, or the like, to expose top surfaces of the conductive pillars 152. In some embodiments, the insulating layer 154 may be deposited as a liquid molding compound molded onto the dielectric layer 148 and the metallization pattern 150 and surrounding the conductive pillars 152.

Figure 14:
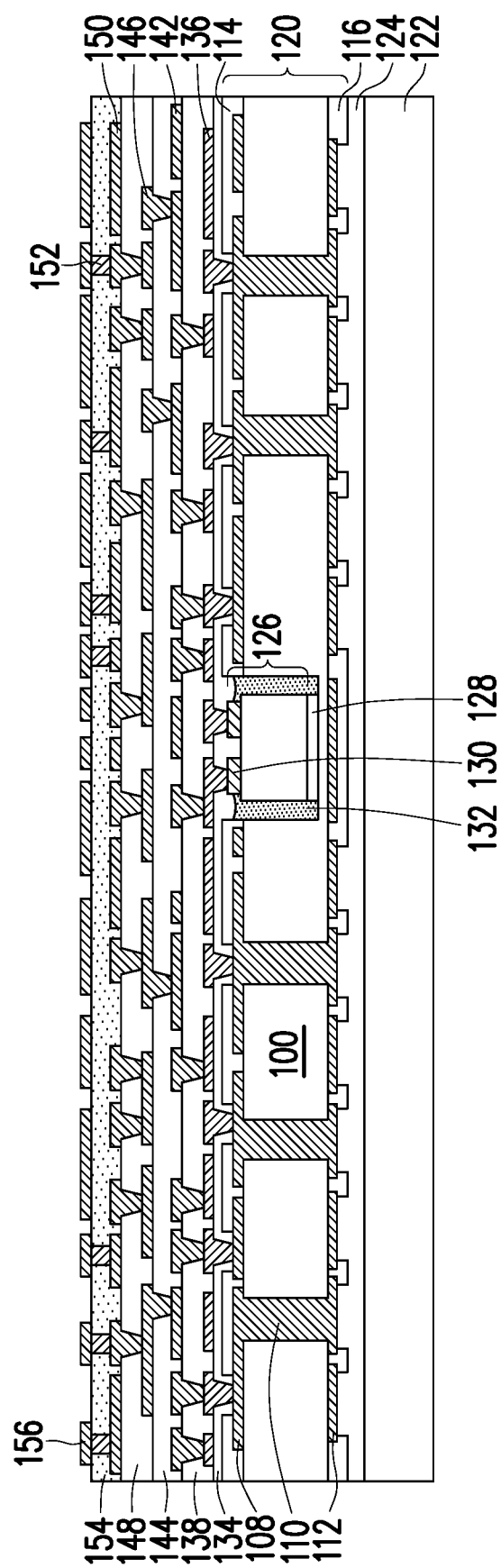

In FIG. 14, conductive traces 156 are formed over the conductive pillars 152 and the insulating layer 154. The conductive traces 156 may be formed using processes, techniques, and materials similar to those described above with reference to forming the metallization pattern 136 as illustrated in FIG. 10, wherein a seed layer is deposited, a patterned mask is formed over the seed layer, a plating process is performed to form the metallization pattern, the patterned mask is removed, and unused portions of the seed layer are removed.

Figure 15:
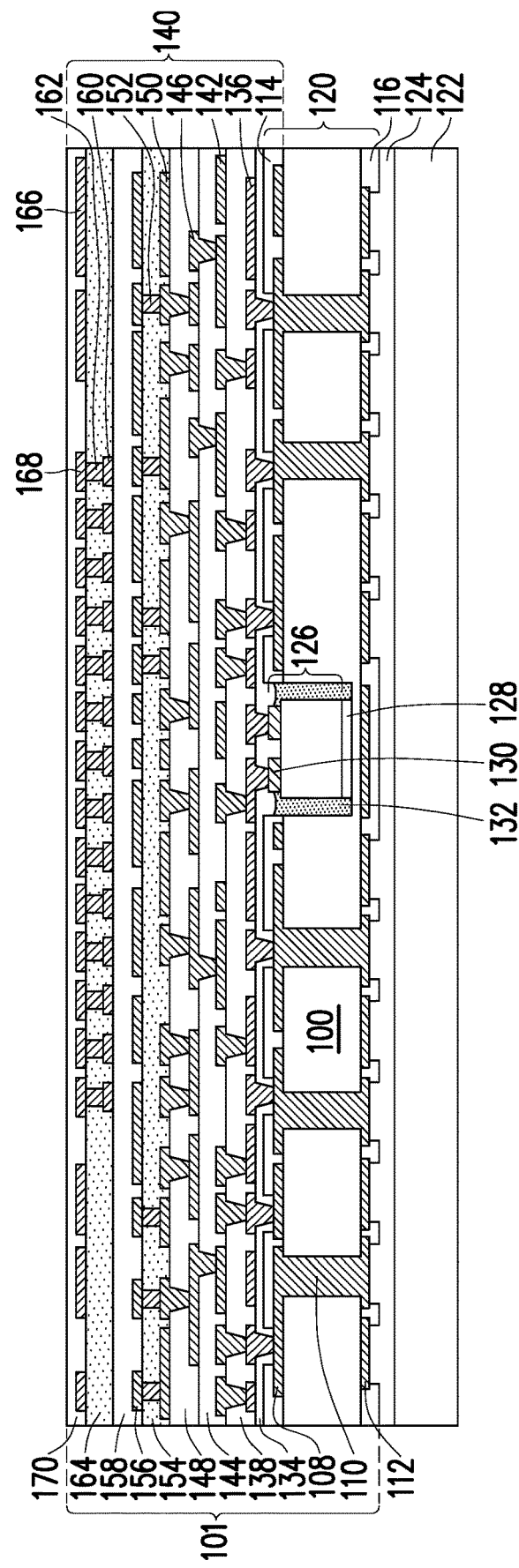

In FIG. 15, a dielectric layer 158, conductive traces 160, conductive pillars 162, an insulating layer 164, conductive traces 166, and under-bump metallizations (UBMs) 168 are formed over the conductive traces 156 and the insulating layer 154. The dielectric layer 158 may be formed using processes, techniques, and materials similar to those described above with reference to forming the dielectric layer 134, as illustrated in FIG. 9. The conductive traces 160 and 166 and the conductive pillars 162 may be formed using processes, techniques, and materials similar to those described above with reference to forming the metallization pattern 136 as illustrated in FIG. 10, wherein a seed layer is deposited, a patterned mask is formed over the seed layer, a plating process is performed to form the metallization pattern, the patterned mask is removed, and unused portions of the seed layer are removed. Although not illustrated in FIG. 15, conductive vias may be formed extending through the dielectric layer 158 and electrically connecting the conductive traces 160 to the conductive traces 156. The insulating layer 164 may be formed using processes, techniques, and materials similar to those described above with reference to forming the insulating layer 154, as illustrated in FIG. 13.

The UBMs 168 may be formed over the insulating layer 164 and the conductive pillars 162. The UBMs 168 include solderable metal surfaces that may serve as an interface between subsequently formed solder bump (e.g., conductive connectors 174 illustrated in FIG. 17A) and the front-side redistribution structure 140. As illustrated in FIG. 15, the UBMs 168 may be electrically and physically connected to the conductive pillars 162. The UBMs 168 may be formed using processes, techniques, and materials similar to those used to form the metallization pattern 136, illustrated in FIG. 10. The dielectric layer 170 may then be formed over the insulating layer 164, the conductive traces 166, and the UBMs 168 using processes, techniques, and materials similar to those described above with reference to forming the dielectric layer 134, as illustrated in FIG. 9.

More or fewer dielectric layers, insulation layers, metallization patterns, conductive traces, and conductive pillars may be formed in the front-side redistribution structure 140. In some embodiments, the front-side redistribution structure 140 may include from 1 to 10 dielectric layers/insulation layers; however, the front-side redistribution structure 140 may be optional and may not be included in some embodiments. If fewer dielectric layers and metallization patterns are to be formed, steps and process discussed above may be omitted. If more dielectric layers and metallization patterns are to be formed, steps and processes discussed above may be repeated. Each of the dielectric layers 134, 138, 144, 148, 158, and 170 and each of the insulation layers 154 and 164 may have a thickness from about 5 μm to about 100 μm, such as about 30 μm.

In the embodiment described above, two insulation layers 154 and 164 are included in the front-side redistribution structure 140. The insulation layers 154 and 164 may be formed of a molding compound material, which has a lower impedance than the dielectric materials used to form the dielectric layers 134, 138, 144, 148, 158, and 170. As such, the insulation layers 154 and 164 may be included in the front-side redistribution structure 140 in order to control the impedance of the front-side redistribution structure 140 and match the impedance of the front-side redistribution structure to a desired value. For example, the impedance of the front-side redistribution structure 140 including the insulation layers 154 and 164 may be between about 90Ω and about 100Ω, such as about 100Ω.

Figure 16:
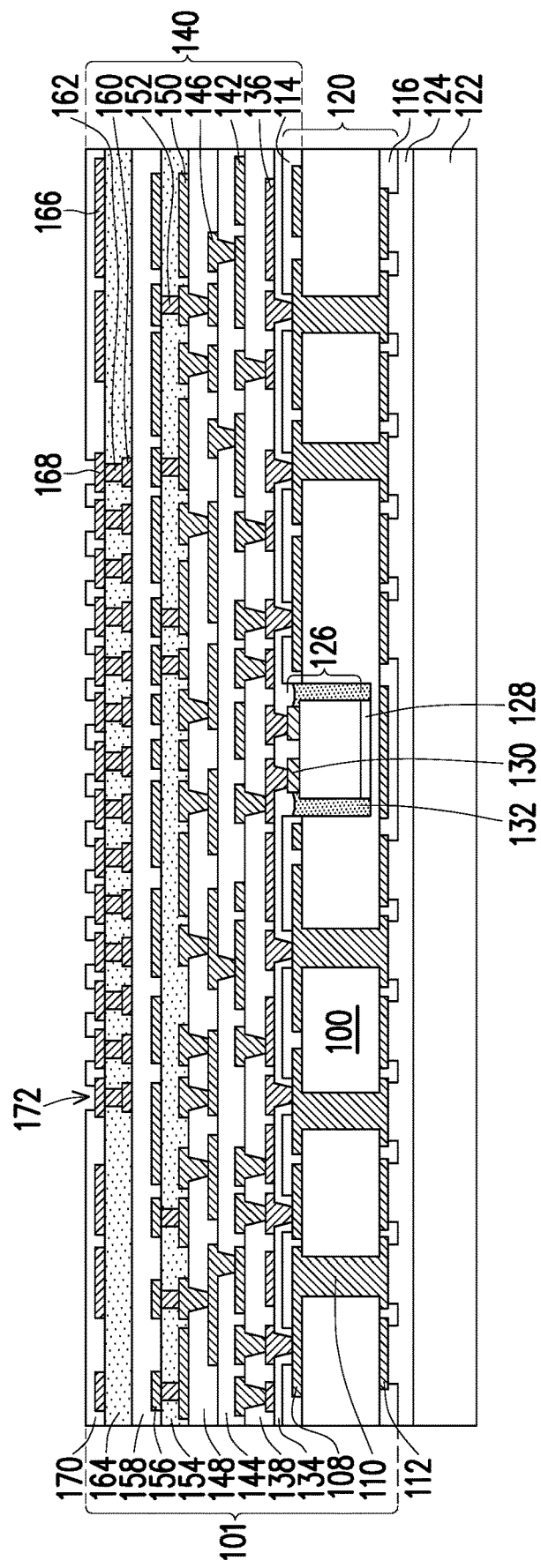
FIG. 16 illustrates a formation of openings in the front-side redistribution structure, in accordance with some embodiments.

In FIG. 16, the dielectric layer 170 is patterned to form openings 172 exposing portions of the UBMs 168. The patterning may be done by exposing the dielectric layer 170 to light when the dielectric layer 170 is a photo-sensitive material. In embodiments in which the dielectric layer 170 is formed of material that are not photosensitive, the dielectric layer 170 may be patterned by etching with a suitable etching process (e.g., anisotropic reactive ion etching) through a patterned photoresist mask.

Figure 17A:
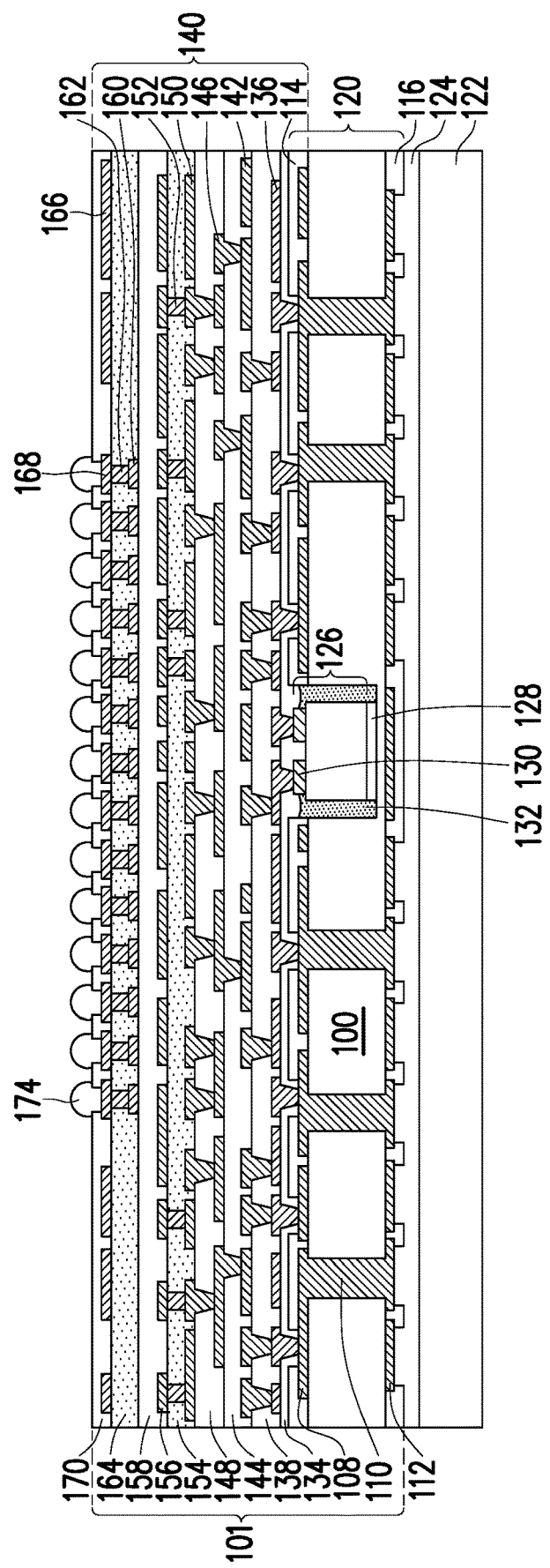
FIG. 17A illustrates a formation of conductive connectors on the front-side redistribution structure, in accordance with some embodiments.

In FIG. 17A, conductive connectors 174 are formed on the UBMs 168. The conductive connectors 174 may be ball grid array (BGA) connectors, solder balls, conductive pillars, controlled collapse chip connection (C4) bumps, micro bumps, electroless nickel-electroless palladium-immersion gold technique (ENEPIG) formed bumps, or the like. The conductive connectors 174 may include a conductive material such as solder, copper, aluminum, gold, nickel, silver, palladium, tin, the like, or a combination thereof. In some embodiments, the conductive connectors 174 are formed by initially forming a layer of solder over the structure of FIG. 16 through a process such as evaporation, electroplating, printing, solder transfer, ball placement, or the like. Once the layer of solder has been formed, a reflow may be performed in order to shape the solder material into the desired bump shapes. In another embodiment, the conductive connectors 174 are conductive pillars (such as copper pillars) formed by sputtering, printing, electroplating, electroless plating, CVD, or the like. The conductive connectors 174 may be solder-free and may have substantially vertical sidewalls. In some embodiments, a metal cap layer (not separately illustrated) is formed on the top of the conductive pillars. The metal cap layer may include nickel, tin, tin-lead, gold, silver, palladium, indium, nickel-palladium-gold, nickel-gold, the like, or a combination thereof and may be formed by a plating process.

Figure 17C:
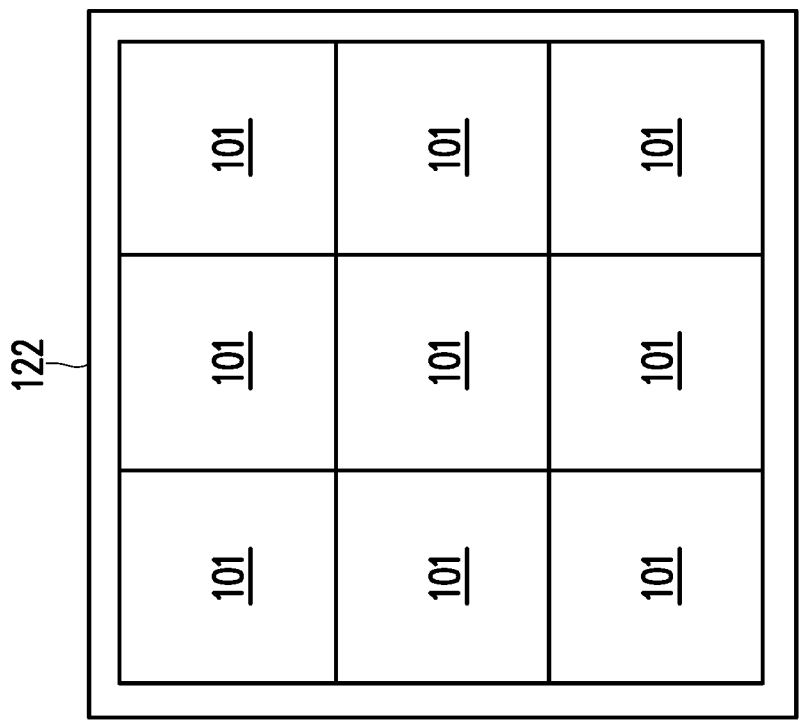
FIGS. 17B and 17C illustrate first packages formed over a carrier, in accordance with some embodiments.
Figure 17B:
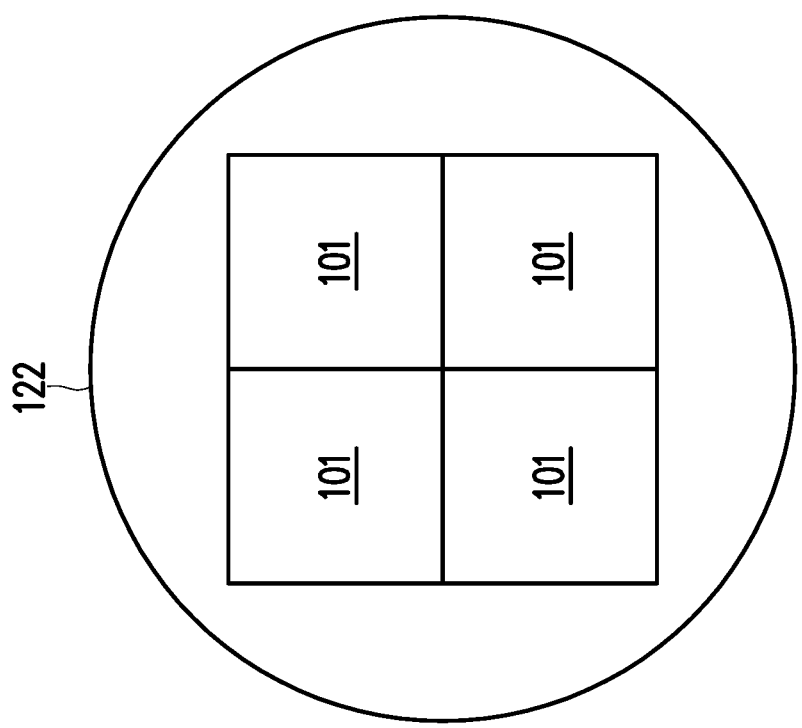

A plurality of first packages 101 may be formed on a single carrier substrate 122. As illustrated in FIG. 17B, the first packages 101 may have rectangular shapes, the carrier substrate 122 may have a round shape, such as a circular shape, and the carrier substrate 122 may be referred to as a wafer. As illustrated in FIG. 17C, the first packages 101 may have rectangular shapes, the carrier substrate 122 may have a rectangular shape, and the carrier substrate 122 may be referred to as a panel. The first packages 101 may be singulated from one another such as by sawing, dicing, or the like. The first packages 101 may be singulated prior to removing the carrier substrate 122. Although four first packages 101 are illustrated in FIG. 17B and nine first packages 101 are illustrated in FIG. 17C, any number of first packages 101 may be formed on the carrier substrate 122, such as from a single first package 101 to thousands of first packages 101.

Figure 18:
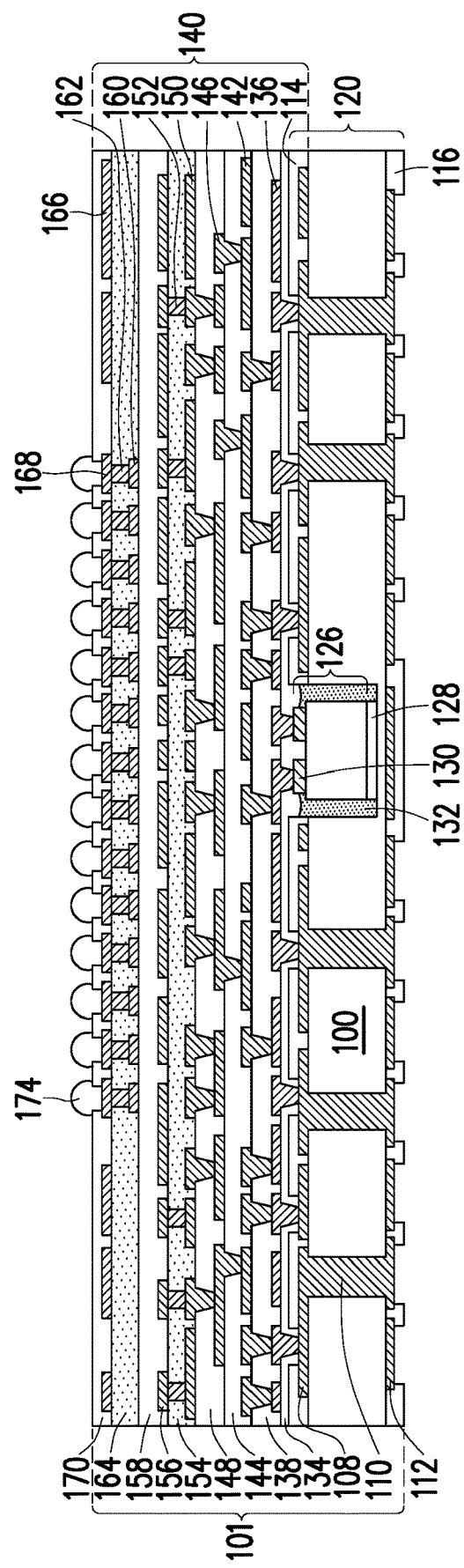
FIG. 18 illustrates a de-bonding of the carrier, in accordance with some embodiments.

In FIG. 18, a carrier substrate de-bonding process is performed to detach (de-bond) the carrier substrate 122 from the protective layer 116 of the cavity substrate 120, in accordance with some embodiments. In embodiments in which the release layer 124 is a light-sensitive adhesive, the de-bonding may be performed by projecting a light such as a laser light or a UV light on the release layer 124 so that the release layer 124 decomposes and the carrier substrate 122 can be removed. A cleaning process may be performed to remove residue of the release layer 124 from the protective layer 116. Detaching the carrier substrate 122 exposes the protective layer 116 and the openings therein.

Figure 19:
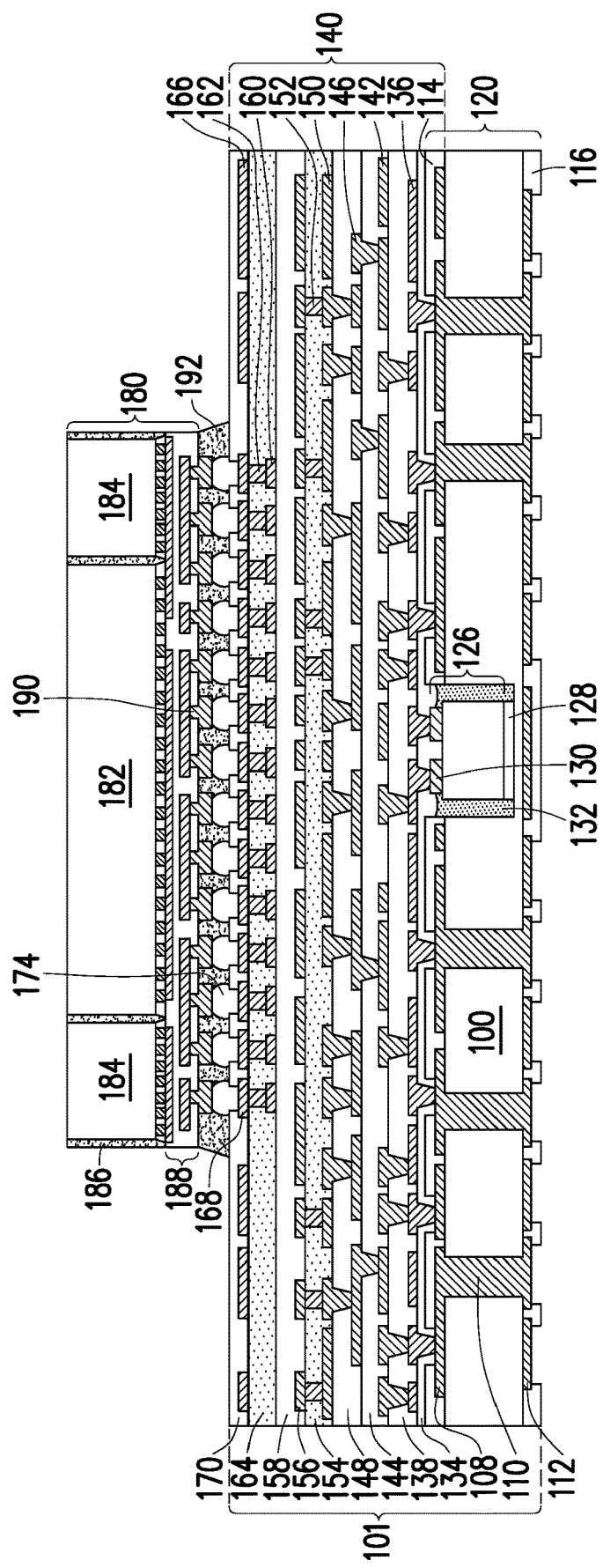
FIG. 19 illustrates a bonding of packaged semiconductor devices, in accordance with some embodiments.

In FIG. 19, packaged semiconductor devices 180 are bonded to the conductive connectors 174. The packaged semiconductor devices 180 may be arranged, for example, by a pick and place machine (not separately illustrated), over the front-side redistribution structure 140, according to an embodiment. However, any other alternative method of arranging the packaged semiconductor devices 180 on the front-side redistribution structure 140 may be used.

In an embodiment, the packaged semiconductor devices 180 may include a processor die 182 (e.g., an xPU), such as a central processing unit (CPU), a micro control unit (MCU), a graphics processing unit (GPU), an application processor (AP), or the like. The packaged semiconductor devices 180 may also include additional dies 184 such as a memory die (e.g., dynamic random-access memory (DRAM) die, a wide input/output (I/O) die, a magnetic random-access memory (MRAM) die, a resistive random-access memory (RRAM) die, a NAND die, a static random-access memory (SRAM) die, or the like), a memory cube (e.g., a high bandwidth memory (HBM), a hybrid memory cube (HMC), or the like), a high data rate transceiver die, an I/O interface die, an integrated passive device (IPD) die, a power management die (e.g., a power management integrated circuit (PMIC) die), a radio frequency (RF) die, a sensor die, a micro-electro-mechanical-system (MEMS) die, a signal processing die (e.g., a digital signal processing (DSP) die), a front-end die (e.g., an analog front-end (AFE) die), a monolithic 3D heterogeneous chiplet stacking die, the like, or a combination thereof. The processor die 182 and the additional dies 184 may be linked together via a combination of HMC links, through-silicon vias (TSVs), and microbumps and may be embedded in an encapsulation material 186. In some embodiments, the packaged semiconductor devices 180 may be a single chip-on-wafer (CoW) device, a system on chip (SoC) device, an integrated fan-out (InFO) device, a single die, or a package including one or more dies. External contacts of the packaged semiconductor devices 180 may be disposed on first surfaces of the packaged semiconductor devices 180 opposite thinned backside second surfaces of the packaged semiconductor devices 180.

Furthermore, the packaged semiconductor devices 180 may include an integrated fan out (InFO) structure 188 with external contacts 190. The InFO structure 188 may include a plurality of dielectric layers and redistribution layers (RDLs) for interconnecting the external contacts of the packaged semiconductor devices 180 arranged on a first side of the InFO structure 188 to the external contacts 190 arranged on a second side of the InFO structure 188 opposite the first side of the InFO structure 188.

In an embodiment, the external contacts 190 may be, e.g., conductive pillars such as a copper pillars or copper posts. In some embodiments, the external contacts 190 may be solder bumps, copper bumps, or other suitable external contacts 190 that may be made to provide electrical connection from the packaged semiconductor devices 180 to other external devices through, for example, the conductive connectors 174 and the front-side redistribution structure 140. All such external contacts are fully intended to be included within the scope of the embodiments.

As further illustrated in FIG. 19, in an embodiment, the packaged semiconductor devices 180 may be arranged over the front-side redistribution structure 140 such that the external contacts 190 of the packaged semiconductor devices 180 are aligned and placed in contact with the conductive connectors 174 on the front-side redistribution structure 140. Once arranged, a bonding procedure may be performed to bond the packaged semiconductor devices 180 to the front-side redistribution structure 140. The external contacts may be bonded to the conductive connectors 174 using metal-to-metal bonding, solder bonding, or the like.

An underfill material 192 may be formed in openings between the InFO structure 188 and the front-side redistribution structure 140 and surrounding the conductive connectors 174 and the external contacts 190. The underfill material 192 may be formed by a capillary underfill process after the packaged semiconductor devices 180 have been attached. In another embodiment, the underfill material 192 may be provided by a suitable deposition process prior to the packaged semiconductor devices 180 being attached.

FIG. 19 illustrates that the packaged semiconductor devices 180 are connected to the first die 126 through the front-side redistribution structure 140, the conductive connectors 174, and the InFO structure 188. Disposing the first die 126 in the cavity 118 of the cavity substrate 120 allows the distance between the first die 126 and the packaged semiconductor devices 180 to be reduced. For example, a distance between the first die 126 and the packaged semiconductor devices 180 may be less than about 0.3 mm or from about 0.1 mm to about 0.5 mm. In contrast, alternative packaging structures may have a distance between a first die 126 and a packaged semiconductor device 180 of greater than about 10 mm. Reducing this distance reduces the voltage drop between the first die 126 and the packaged semiconductor devices 180, which improves the power integrity and power integrity of the packaged semiconductor device (e.g., the SoIS 200, discussed below with respect to FIG. 21) including the first die 126 and the packaged semiconductor devices 180.

Figure 20:
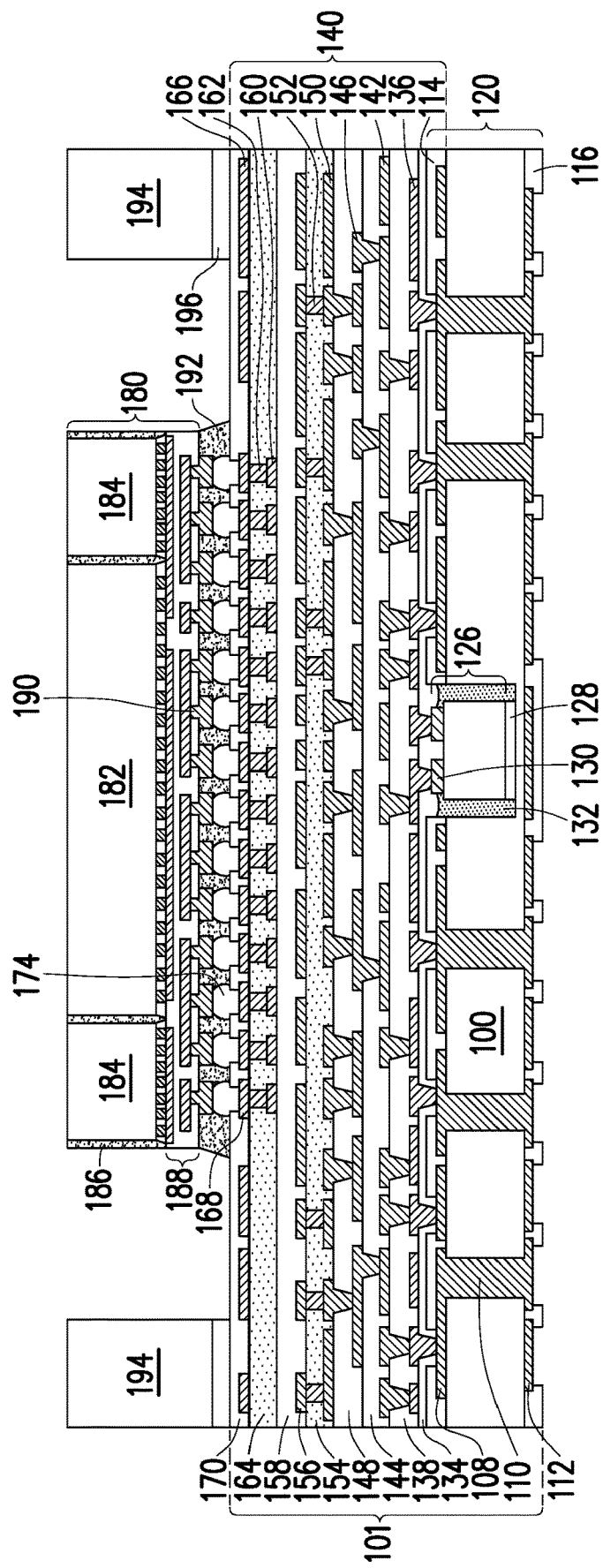
FIG. 20 illustrates an attachment of a ring structure, in accordance with some embodiments.

In FIG. 20, a ring structure 194 is attached to the front-side redistribution structure 140 surrounding the packaged semiconductor devices 180. The ring structure 194 may be attached to protect the packaged semiconductor devices 180, to add stability to the first package 101, and to dissipate heat from the packaged semiconductor devices 180 and the first package 101. The ring structure 194 may be formed from a material having a high thermal conductivity, such as steel, stainless steel, copper, aluminum, combinations thereof, or the like. In some embodiments, the ring structure 194 may be a metal coated with another metal, such as gold. In various embodiments, the ring structure 194 may be a lid which covers upper surfaces of the packaged semiconductor devices 180. An adhesive 196 may be used to secure the ring structure 194 to the front-side redistribution structure 140.

Figure 21:
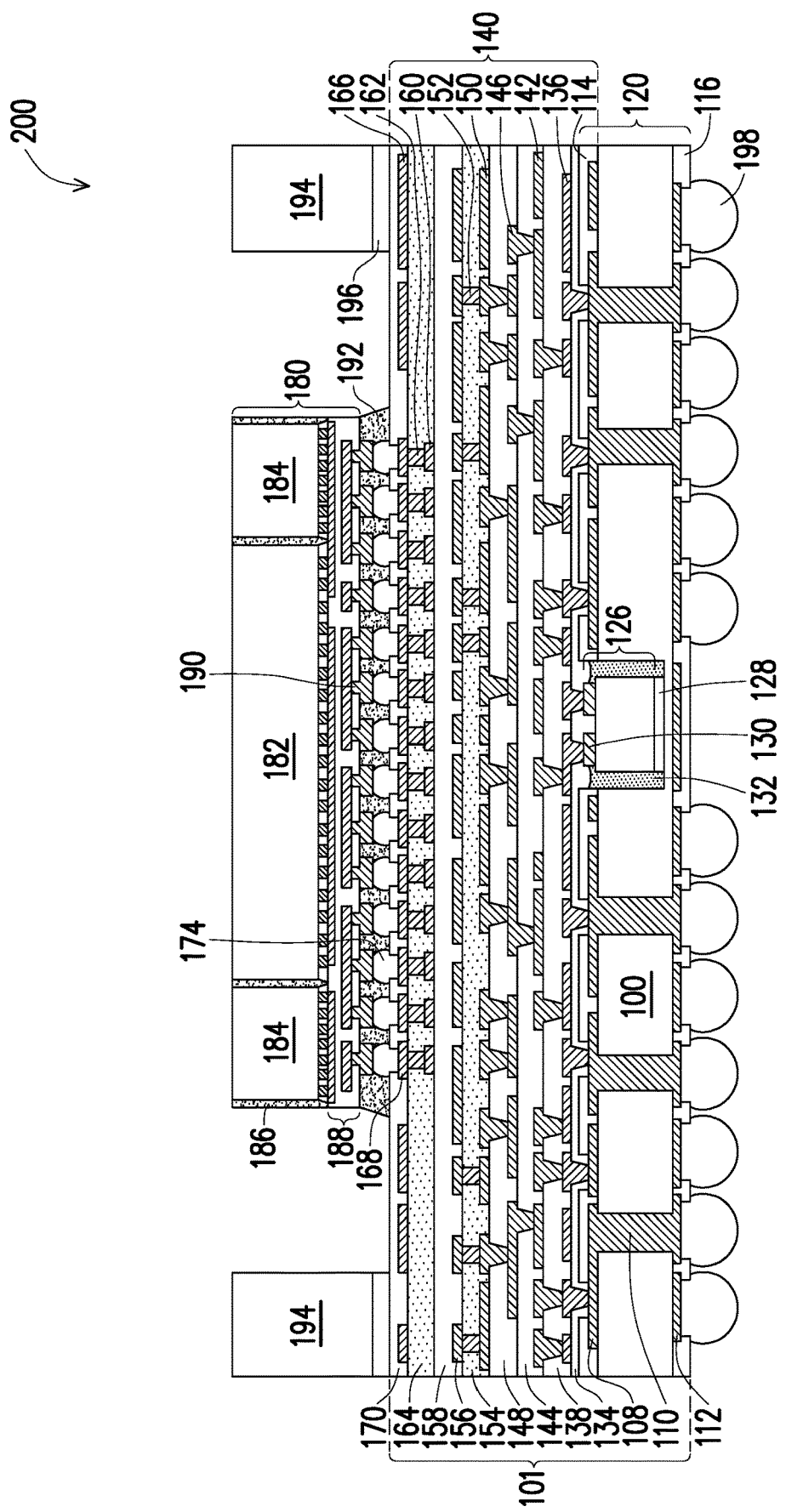
FIG. 21 illustrates a formation of conductive connectors on a backside of the substrate, in accordance with some embodiments.

In FIG. 21, conductive connectors 198 are formed on the second conductive traces 112 to form a system on integrated substrate (SoIS) 200. The conductive connectors 198 may be BGA connectors, solder balls, conductive pillars, C4 bumps, micro bumps, ENEPIG-formed bumps, or the like. The conductive connectors 198 may include a conductive material such as solder, copper, aluminum, gold, nickel, silver, palladium, tin, the like, or a combination thereof. In some embodiments, the conductive connectors 198 are formed by initially forming a layer of solder over the structure of FIG. 20 through a process such as evaporation, electroplating, printing, solder transfer, ball placement, or the like. Once the layer of solder has been formed, a reflow may be performed in order to shape the solder material into the desired bump shapes. In another embodiment, the conductive connectors 198 are conductive pillars (such as copper pillars) formed by sputtering, printing, electroplating, electroless plating, CVD, or the like. The conductive connectors 198 may be solder-free and may have substantially vertical sidewalls. In some embodiments, a metal cap layer (not separately illustrated) is formed on the top of the conductive pillars. The metal cap layer may include nickel, tin, tin-lead, gold, silver, palladium, indium, nickel-palladium-gold, nickel-gold, the like, or a combination thereof and may be formed by a plating process.

Attaching the first die 126 in the cavity 118 of the cavity substrate 120 and then connecting the packaged semiconductor devices 180 are connected to the first die 126 through the front-side redistribution structure 140, the conductive connectors 174, and the InFO structure 188 minimizes the distance between the first die 126 and the packaged semiconductor devices 180. This reduces the voltage drop between the first die 126 and the packaged semiconductor devices 180, which improves the power integrity and overall performance of the SoIS 200.

In accordance with an embodiment, a package includes a substrate; a first die disposed within the substrate; a redistribution structure over the substrate and the first die; and an encapsulated device over the redistribution structure, the redistribution structure coupling the first die to the encapsulated device. In an embodiment, the first die includes a multilayer ceramic capacitor (MLCC). In an embodiment, the first die includes an integrated passive device (IPD). In an embodiment, the first die includes an integrated voltage regulator (IVR). In an embodiment, the first die includes a static random access memory (SRAM) die. In an embodiment, a distance between the encapsulated device and the first die is less than 0.3 mm. In an embodiment, the redistribution structure includes one or more molding compound layers. In an embodiment, each of the one or more molding compound layers has a thickness from 5 µm to 100 µm. In an embodiment, the package further includes a ring structure attached to the redistribution structure, the ring structure surrounding the encapsulated device. In an embodiment, the package further includes an underfill material surrounding sidewalls of the first die.

In accordance with another embodiment, a method includes forming a cavity in a substrate; attaching a first die to the substrate, the first die being disposed within the cavity; forming a redistribution structure over a first side of the substrate and the first die; and attaching a semiconductor device to the redistribution structure, the semiconductor device including a second die encapsulated by an encapsulant. In an embodiment, the method further includes filling the cavity with an underfill after attaching the first die to the substrate. In an embodiment, the first die is attached to the substrate using an adhesive. In an embodiment, forming the redistribution structure includes forming a via over the first side of the substrate and the first die and forming a molding compound surrounding the via, the molding compound being coterminous with the substrate.

In accordance with yet another embodiment, a method includes forming a cavity in a substrate; mounting the substrate on a carrier; attaching a first device to the substrate within the cavity; and coupling a second device to the first device, the second device being encapsulated by an encapsulant, the second device being disposed over the first device in a direction perpendicular to a major surface of the substrate. In an embodiment, the method further includes depositing an underfill surrounding the first device. In an embodiment, the method further includes forming a front-side redistribution structure over a front-side of the substrate and the first device, the front-side redistribution structure including one or more molding compound layers, the second device being coupled to the first device through the front-side redistribution structure. In an embodiment, the carrier is de-bonded from the substrate before coupling the second device to the first device. In an embodiment, the method further includes forming electrical connectors over a backside of the substrate after de-bonding the carrier. In an embodiment, the cavity is formed using mechanical drilling.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
a substrate;
a first die disposed within the substrate, wherein a back surface of the first die is attached to the substrate by a first adhesive;
a first underfill material between the first die and the substrate, the first underfill material extending along a first sidewall of the first adhesive and a second sidewall of the first die from the back surface of the first die to a front surface of the first die, wherein at least a portion of the first sidewall is aligned with at least a portion of the second sidewall;
a redistribution structure over the substrate and the first die;
an encapsulated device over the redistribution structure, the redistribution structure coupling the first die to the encapsulated device;
a plurality of conductive connectors bonding the encapsulated device to the redistribution structure; and
a second underfill material extending between the redistribution structure and the encapsulated device, the second underfill material surrounding the plurality of conductive connectors, the second underfill material comprising a material different from an encapsulant encapsulating the encapsulated device.
2. The package of claim 1, wherein the first die comprises a multilayer ceramic capacitor (MLCC).
3. The package of claim 1, wherein the first die comprises an integrated passive device (IPD).
4. The package of claim 1, wherein the first die comprises an integrated voltage regulator (IVR).
5. The package of claim 1, wherein the first die comprises a static random access memory (SRAM) die.
6. The package of claim 1, wherein a distance between the encapsulated device and the first die is less than 0.3 mm.
7. The package of claim 1, wherein the redistribution structure comprises one or more molding compound layers.
8. The package of claim 7, wherein each of the one or more molding compound layers has a thickness from 5 µm to 100 µm.
9. The package of claim 1, further comprising a ring structure attached to the redistribution structure, the ring structure surrounding the encapsulated device.
10. The package of claim 1, further comprising a third underfill material surrounding sidewalls of the first die.
11. A semiconductor package comprising:
a substrate;
a first die attached to the substrate by an adhesive, wherein the first die is disposed within the substrate between a first sidewall of the substrate and a second sidewall of the substrate;
a redistribution structure over the substrate and the first die, the redistribution structure having a width equal to a width of the substrate, the redistribution structure comprising a dielectric layer and a molding compound layer, the molding compound layer comprising a first material different from a second material of the dielectric layer;
a first semiconductor device attached to the redistribution structure and electrically coupled to the redistribution structure;

a second semiconductor device attached to the redistribution structure adjacent the first semiconductor device in a direction parallel to a major surface of the substrate and electrically coupled to the redistribution structure; and an encapsulant surrounding the first semiconductor device and the second semiconductor device, wherein a top surface of the first semiconductor device opposite the substrate, a top surface of the second semiconductor device opposite the substrate, and a top surface of the encapsulant opposite the substrate are level with one another.

12. The semiconductor package of claim 11, further comprising an underfill surrounding the first die and the adhesive, the underfill comprising a vertical surface perpendicular to the major surface of the substrate, the vertical surface contacting sidewalls of the first die and the adhesive.

13. The semiconductor package of claim 11, further comprising a ring structure encircling the first semiconductor device and the second semiconductor device in a plane parallel to the major surface of the substrate, wherein the ring structure is attached to the redistribution structure by a second adhesive.

14. The semiconductor package of claim 11, wherein the first material of the molding compound layer has a lower impedance than the second material of the dielectric layer.

15. A semiconductor package comprising:
a first device attached to a substrate, wherein the first device is disposed in a cavity in the substrate, the cavity comprising opposite sidewalls and a mounting surface extending between the opposite sidewalls, wherein the first device is attached to the mounting surface, and wherein the first device is disposed between the opposite sidewalls;
a first dielectric layer over the substrate, the first dielectric layer comprising an opening having a first width equal to a second width of the cavity;
an underfill surrounding the first device, the underfill comprising a concave top surface opposite the mounting surface of the substrate, the concave top surface extending from a side surface of the first dielectric layer to a side surface of the first device;
a second device electrically coupled to the first device, the second device being disposed over the first device in a direction perpendicular to a major surface of the substrate; and
an encapsulant surrounding the second device.

16. The semiconductor package of claim 15, further comprising a front-side redistribution structure over a front-side of the substrate, the first dielectric layer, and the first device, the front-side redistribution structure comprising one or more molding compound layers, wherein the second device is coupled to the first device through the front-side redistribution structure.

17. The semiconductor package of claim 16, further comprising a conductive plug extending through the substrate from the front-side of the substrate to a backside of the substrate.

18. The semiconductor package of claim 17, further comprising an electrical connector over a backside of the substrate, wherein the electrical connector is electrically coupled to the front-side redistribution structure through the conductive plug.

19. The semiconductor package of claim 15, wherein the first device is attached to the substrate by an adhesive.

20. The semiconductor package of claim 15, further comprising a second dielectric layer over the first dielectric layer, the second dielectric layer contacting a top surface of the first dielectric layer and the concave top surface of the underfill.

* * * * *